US012010773B2

United States Patent
Burchard et al.

(10) Patent No.: US 12,010,773 B2
(45) Date of Patent: Jun. 11, 2024

(54) COMPACT CONTROL FOR LAMPS IN A MOTOR VEHICLE

(71) Applicant: ELMOS Semiconductor SE, Dortmund (DE)

(72) Inventors: Bernd Burchard, Dortmund (DE); Christian Schmitz, Dortmund (DE)

(73) Assignee: Elmos Semiconductor SE, Dortmund (DE)

( * ) Notice: Subject to any disclaimer, the term of this patent is extended or adjusted under 35 U.S.C. 154(b) by 0 days.

(21) Appl. No.: 18/044,739

(22) PCT Filed: Sep. 14, 2021

(86) PCT No.: PCT/EP2021/075229
§ 371 (c)(1),
(2) Date: Mar. 9, 2023

(87) PCT Pub. No.: WO2022/053714
PCT Pub. Date: Mar. 17, 2022

(65) Prior Publication Data
US 2023/0380030 A1  Nov. 23, 2023

(30) Foreign Application Priority Data

Sep. 14, 2020 (DE) ............... 10 2020 123 818.5

(51) Int. Cl.
*H05B 45/30* (2020.01)
*H05B 47/11* (2020.01)
*H05B 47/18* (2020.01)

(52) U.S. Cl.
CPC ............. *H05B 45/30* (2020.01); *H05B 47/11* (2020.01); *H05B 47/18* (2020.01)

(58) Field of Classification Search
CPC ........ H05B 45/20; H05B 45/30; H05B 47/10; H05B 47/11; H05B 47/18
See application file for complete search history.

(56) References Cited

U.S. PATENT DOCUMENTS

| 8,810,162 | B2 | 8/2014 | Williams et al. |
| 8,952,619 | B2 | 2/2015 | Williams et al. |
| 9,936,552 | B1 | 4/2018 | Lau et al. |
| 10,437,279 | B2 | 10/2019 | Chang et al. |
| 2012/0169231 | A1* | 7/2012 | Dinc ............ H05B 45/10 315/77 |

FOREIGN PATENT DOCUMENTS

| CN | 104924977 A | 9/2015 |
| CN | 209870229 U | 12/2019 |
| DE | 202004006292 U1 | 7/2004 |
| DE | 102009004117 A1 | 7/2010 |
| EP | 2440018 A1 | 4/2012 |
| EP | 3478031 A1 | 5/2019 |

OTHER PUBLICATIONS

International Preliminary Report on Patentability dated Dec. 20, 2022 in correlated international application No. PCT/EP2021/075229.

* cited by examiner

*Primary Examiner* — Jimmy T Vu
(74) *Attorney, Agent, or Firm* — Michael J. McCandlish; Mindful IP Law PLLC

(57) ABSTRACT

A control device includes a data bus interface, which can be a CAN bus data bus interface, a computer core (microcontroller) and a number $n_{LED}$ of a plurality of driver circuits, wherein $n_{LED}$ is a positive integer greater than 1. Each driver circuit is designed to be able to supply at least one lamp group with electrical power. The $n_{LED}$ driver circuits are thus designed to be able to supply at least $n_{LED}$ lamp groups with electrical power. Each lamp group comprises one or more lamps, which can comprise one or more light-emitting diodes. The data bus interface and the computer core (microcontroller) and the $n_{LED}$ driver circuits are accommodated on a common semiconductor substrate.

15 Claims, No Drawings

COMPACT CONTROL FOR LAMPS IN A MOTOR VEHICLE

CROSS REFERENCE TO RELATED APPLICATIONS

The present patent application is a national stage of, and claims priority to, PCT Application No. PCT/EP2021/075229, filed on Sep. 14, 2021, which application claims the priority of the German patent application 10 2020 123 818.5 filed Sep. 14, 2020, the disclosures of which are incorporated by reference in the present patent application in their entireties.

TECHNICAL FIELD

The disclosure relates to a device for driving an LED lighting device, an LED lighting device having such a driving device, and a method for manufacturing such a driving device.

For example, the disclosure thus relates to a control device for a lighting device with a data bus interface (e.g. a CAN communication data bus interface), a computer core (microcontroller), and with a driver circuit for one or more LED lamps.

BACKGROUND

Normally, the bus driver modules of actuators and microcontrollers of a satellite system/bus system for driving consumers, for example in motor vehicles, are designed as separate modules of a bus subscriber, typically arranged on a common circuit board. The reason for this is that very powerful computers are preferably required, which are then realized in a semiconductor technology node with the smallest possible structure size. In contrast, the so-called bus transceivers, which represent the actual interface to the data buses, comprise power transistors whose structure sizes cannot be reduced arbitrarily for physical reasons, namely due to the required current carrying capacity. As a result, typically two different components (IC chips) are manufactured in two semiconductor technologies, namely the bus transceivers and the drivers/LED (analog part) separately from the powerful computers (digital part), and are mounted on printed circuits.

From DE 20 2004 006 292 U1, for example, a lighting device having a control device with a DALI interface is known. The known control device has several modules, wherein it remains open which components the individual modules comprise.

From DE-A-10 2009 004 117, a projection module is known.

LED lamp control devices with circuit elements of interface, microcontroller and LED driver circuits integrated on a common chip are known from EP-A-3 478 031.

SUMMARY

Therefore, it is an object of the disclosure to provide an optimal solution for LED drivers in automobile systems that avoids the above-mentioned disadvantages of prior art and has further advantages.

The object of the disclosure is achieved, in an example, with a device for driving an LED lighting device, the driving device being provided with
an input designed as a data interface for connection to a communication data bus,
an output with at least one terminal for at least one LED lamp, which comprises an LED or a series circuit of LEDs or a group of differently colored LEDs or a series circuit of groups of respectively differently colored LEDs,
a microcontroller,
one or more LED driver circuits, wherein an LED driver circuit is associated with each terminal of the output for an LED lamp,
wherein the data interface, the microcontroller, the LED driver circuit or the LED driver circuits, and the at least one terminal of the output are electrically connected to each other,
wherein the data interface, the microcontroller, and the LED driver circuit or the LED driver circuits comprise electronic and/or electrical circuit elements (also referred to as circuit components), and
a semiconductor substrate in which the circuit elements of the data interface, the microcontroller and the LED driver circuit or the LED driver circuits are integrated using a semiconductor technology for manufacturing integrated circuits with a smallest possible structure size predetermined by the semiconductor technology,
wherein the semiconductor technology used is determined by what minimum structure size is still permissible for the circuit elements of the data interface and the LED driver circuit or the LED driver circuits in order to ensure their functionality, and
wherein circuit elements of the data interface and/or of the at least one LED driver circuit having the smallest possible structure size have the same structure size as circuit elements of the microcontroller having the smallest possible structure size.

DESCRIPTION

Thus, the disclosure proposes a driving device for an LED lighting device in which a plurality of electrical circuits are integrated in a common semiconductor substrate. These are the circuits for the data interface, the microcontroller and the at least one LED driver. It is essential for the disclosure that the semiconductor technology to be used (and thus the smallest possible structure size of the circuit components) is determined by what minimum structure size is still permissible for the circuit components of the data interface and the at least one LED driver to ensure their functionalities.

In this context, the smallest "structure size" that can be realized when manufacturing an integrated circuit using a semiconductor technology refers to, as is known among those skilled in the art, the shortest edge length of a component (i.e. a structure size of a component) of a circuit component, wherein typically the shortest possible length of the gate of a field-effect transistor is meant. Thus, in the disclosure, the shortest edge length of a circuit component of the data interface and/or the LED driver circuit(s) is equal to the shortest edge length of a part of a circuit component of the microcontroller, namely the shortest gate length of a field effect transistor or field effect transistors of the microcontroller.

Thus, in contrast to what is usual in the prior art and known therefrom, according to the disclosure, the semiconductor technology used is not that which could determine the minimum permissible structural sizes for the circuit components of the microcontroller. As is well known, the circuit components such as transistors and gates of microcontrollers do not need to have the same current carrying capacity as, for example, data interfaces and LED drivers. Therefore, the circuit components of the microcontroller may well be designed in a smaller format than is the case for the analog part of the overall circuit integrated in the semiconductor substrate. So now, typically the semiconductor technology matched to the microcontroller would be used in order to then use said semiconductor technology to make larger format circuit components for the data interface and the at least one LED driver. However, this is more cost-intensive overall because the semiconductor technology that permits a higher density of circuit components is more complex to implement.

The disclosure thus departs from the previously known concept of IC chip design, which, as will be described further below, is associated with significant technical and economic advantages.

Suitable semiconductor technologies are those whose smallest possible structure size is larger than, in particular, 85 nm and smaller than, in particular, 200 nm. All values within the aforementioned range for the smallest possible structure size of the semiconductor technology to be used are hereby covered by the application.

In an expedient configuration according to the disclosure, the device may be provided with a voltage regulator comprising circuit elements integrated in the semiconductor substrate, wherein the semiconductor technology used is determined by what minimum structure size is permissible for the circuit elements of the data interface, of the LED driver circuit or the LED driver circuits and of the voltage regulator in order to ensure their functionality. With the voltage regulator, the semiconductor substrate thus has a further component that is designed as an analog circuit and consequently also includes, for example, power transistors and wider conductor tracks.

In a further expedient configuration according to the disclosure, it may be provided that the device is provided with a test interface having electronic and/or electrical circuit elements integrated in the semiconductor substrate for testing the functionality of the data interface and/or the microcontroller and/or the LED driver circuit or the LED driver circuits and/or the voltage regulator, if present, wherein the semiconductor technology used is determined by what minimum structure size is still permissible for the circuit elements of the data interface, of the LED driver circuit or the LED driver circuits, of the voltage regulator and of the test interface in order to ensure their functionality. This can be, for example, a boundary scan test or tests that specifically address and test certain components of the semiconductor IC.

In a further expedient configuration according to the disclosure, it may be advantageous if the device comprises a sensor system interface having electrical and/or electronic circuit elements integrated in the semiconductor substrate for the connection of at least one sensor such as a light brightness sensor and/or a light color sensor and/or a sun sensor, which are or can be connected to a data communication bus adapted to be connected to the sensor system interface, wherein the semiconductor technology used is determined by what minimum structure size is still permissible for the circuit elements of the data interface, of the LED driver circuit or the LED driver circuits, of the voltage regulator, of the test interface and of the sensor system interface in order to ensure their functionality. For example, such a sensor system interface may be one according to the PSI5 or PSI3 protocol.

In a further expedient configuration according to the disclosure, it may be provided that the microcontroller has only a functionality required to drive the LED driver circuit or the LED driver circuits in accordance with signals received from the data interface and/or signals received from the sensor system interface, if present, and required to process signals received from the test interface, if present. By reducing the performance of the microcontroller, the space required for its gates, transistors and other circuit elements and conductor tracks can be reduced, which is particularly advantageous given the fact that the semiconductor technology used for the microcontroller is not that which provides the smallest possible structure size still permissible for digital parts.

The circuit elements, whose functionality must be ensured when manufacturing by means of the semiconductor technology used, may be transistors and/or conductor tracks.

According to the disclosure it is now also possible to realize an LED lighting device which is provided with
an LED lamp, which comprises an LED or a series circuit of LEDs or a group of differently colored LEDs or a series circuit of groups of respectively differently colored LEDs,
wherein the LED lamp is electrically connected to the output of a device according to any one of the preceding claims.

According to the disclosure, the aforementioned object is achieved by further proposing a method for manufacturing a device for driving an LED lighting device,
wherein the driving device is provided with:
an input designed as a data interface for connection to a communication data bus,
an output with at least one terminal for at least one LED lamp, which comprises an LED or a series circuit of LEDs or a group of differently colored LEDs or a series circuit of groups of respectively differently colored LEDs,
a microcontroller,
one or more LED driver circuits, wherein an LED driver circuit is associated with each terminal of the output for an LED lamp,
wherein the data interface, the microcontroller, the LED driver circuit or the LED driver circuits, and the at least one terminal of the output are electrically connected to each other,
wherein the data interface, the microcontroller, and the LED driver circuit or the LED driver circuits comprise electronic and/or electrical circuit elements, and
a semiconductor substrate,
wherein the circuit elements of the data interface, of the microcontroller and of the LED driver circuit or the LED driver circuits are integrated in the semiconductor substrate using a semiconductor technology for manufacturing integrated circuits with a smallest possible structure size predetermined by the semiconductor technology, and
wherein the semiconductor technology used is determined by what minimum structure size is still permissible for the circuit elements of the data interface and of the LED driver circuit or the LED driver circuits in order to ensure their functionality.

It may be advantageous in the method according to the disclosure that the device has a voltage regulator with circuit elements integrated in the semiconductor substrate, wherein the semiconductor technology used is determined by what minimum structure size is still permissible for the circuit elements of the data interface, of the LED driver circuit or the LED driver circuits and of the voltage regulator in order to ensure their functionality.

A further expedient configuration of the method according to the disclosure may provide that the device comprises a test interface having electronic and/or electrical circuit elements integrated in the semiconductor substrate for testing the functionality of the data interface and/or of the microcontroller and/or of the LED driver circuit or the LED driver circuits and/or of the voltage regulator, if present, wherein the semiconductor technology used is determined by what minimum structure size is still permissible for the circuit elements of the data interface, of the LED driver circuit or the LED driver circuits, of the voltage regulator and of the test interface in order to ensure their functionality.

A further expedient configuration of the method may include that the driving device comprises a sensor system interface having electrical and/or electronic circuit elements integrated in the semiconductor substrate for the connection of at least one sensor such as a light brightness sensor and/or a light color sensor and/or a sun sensor, which are or can be connected to a data communication bus adapted to be connected to the sensor system interface, wherein the semiconductor technology used is determined by what minimum structure size is still permissible for the circuit elements of the data interface, of the LED driver circuit or the LED driver circuits, of the voltage regulator, of the test interface and of the sensor system interface (PSI5, PSI3) in order to ensure their functionality.

It is advantageous if the microcontroller is provided only with a functionality required to drive the LED driver circuit or the LED driver circuits in accordance with signals received from the data interface and/or signal received from the sensor system interface, if present, and required to process signals received from the test interface, if present.

It is expedient if the semiconductor technology used is a semiconductor technology with a smallest possible structure size that is larger than 85 nm or larger than 90 nm or larger than 100 inn or larger than 110 nm or larger than 120 nm or larger than 130 nm or larger than 140 nm or larger than 150 nm or larger than 160 nm or larger than 170 nm or larger than 180 nm or larger than 190 nm.

It is expedient if the semiconductor technology used is a semiconductor technology with a smallest possible structure size that is smaller than 200 nm or smaller than 190 nm or smaller than 180 nm or smaller than 170 nm or smaller than 160 nm or smaller than 150 nm or smaller than 140 nm or smaller than 130 nm or smaller than 120 nm or smaller than 110 nm or smaller than 100 nm or smaller than 90 nm or smaller than 85 nm.

The disclosure is a shift away from the technically typical established ways and the technical development to date, namely by operating a co-integration of LED drivers, transceivers and microcontrollers on a semiconductor substrate without any loss of computing power required for the application.

The proposal according to the disclosure increases the usefulness of the driving device, firstly by reducing the chip area and secondly by reducing the assembly effort required to implement the driving device. Among those skilled in the art, the computing power of the microcontroller would not be lowered in favor of the co-integration according to the disclosure, since this would lower the possibilities of software design of the driving device, which is against the efforts of those skilled in the art to want to give new systems better computing performance.

The application of the device according to the disclosure is mainly in vehicles and thus in "mass-produced goods". Particularly in the case of mass-produced goods or mass-produced articles, even the smallest advances can have a major impact or give rise to the recognition of an disclosure. The disclosure substantially simplifies production, manufacture and technical use and thus, as a consequence of these technical advantages, offers significant economic advantages, which in the present case is the basis for according the construction as an disclosure.

The lower computing power of the microcontroller possible according to the disclosure faces the technical advantage of simplification superimposing all this and the resulting increased economic efficiency. Lowering the computing performance of the microcontroller thus leads to a technically improved solution as a co-integration, as described above. This contradicts the efforts of the expert world, in which it is well known that, according to Mour's law, the complexity of integrated circuits regularly doubles with minimum component cost, Gordon Mour understanding complexity to be the number of circuit components on an integrated circuit. Sometimes it is also referred to a doubling of the integration density, i.e. the number of transistors per unit area. As is well known, this technical development forms an essential basis of the "digital revolution". So, if the those skilled in the art make efforts to use this always doubling integration density, the inventive idea clearly contradicts this effort, namely to select the semiconductor technology on the basis of the smallest possible structure size of the circuit components of the data interface (transceiver) and the LED drivers as well as possibly further analog parts of the circuit and just not on the basis of the smallest possible structure sizes for the digital part (microcontroller).

Basically, when designing semiconductor ICs with digital and analog parts, the aim is to use the semiconductor technology for manufacturing the semiconductor IC whose smallest possible structure size is matched to the needs and requirements as well as conditions of the digital part. The transistors and gates of the digital part of a semiconductor IC are in a much smaller format than the transistors of analog parts, which usually have to be designed as power transistors with appropriate current carrying capacity. With regard to semiconductor technology, one is always on the safe side if the selection of this technology is based on the fact that it can provide the smallest possible structure sizes for the digital part. This means that the larger-area circuit elements of the analog part can then also be manufactured using this semiconductor technology.

The smaller the smallest possible structure size of the semiconductor technology used, the more complex and cost-intensive its application. The disclosure therefore takes a different approach. The starting point for selecting the semiconductor technology to be used is now no longer the smallest possible permissible structure size for the digital part of the circuit, but the minimum structure size that ensures the functionality of the analog part. This means that the gates and transistors of the digital part now take up larger chip areas. This larger chip area can be compensated for, at least in part, by reducing the computer performance to what is needed for the application. Thus, the chip area required for the digital part may be larger compared to the use of a semiconductor technology with higher integration density, however, overall this leads to an advantageous result for economic efficiency, since a simpler and less complex semiconductor technology is used whose integration density, because it is designed for analog parts, is lower.

For the reasons mentioned before, one can therefore accept the reduction of the computer performance of the microcontroller with the advantage of the co-integration of all circuit elements in a semiconductor technology, whose smallest possible structure size is certainly larger than in semiconductor technologies for the realization of digital parts, which, however, leads to an advantage again due to the lower costs when using such a comparatively "coarse" semiconductor technology.

It has thus been recognized according to the disclosure that, in contrast to the common integration strategies as described above, when combined with lamp drivers whose driver transistors cannot be made arbitrarily smaller, there is surprisingly a significant cost advantage in that full integration is performed in the technology node with the larger structure size, even though this increases the chip area for the microcontroller. This combination of these technical features results in a surprising reduction in technical effort and, consequently, a surprising, substantial economic advantage.

There was the technical prejudice among those skilled in the art that co-integration of lamp drivers, computer system (microcontroller) and data bus interface would lead to a considerable increase in the required chip area and thus to considerably higher costs; this is because the computer system is thereby produced with a semiconductor technology, which would also lead to an increase in the chip area requirement of the computer system due to the larger minimum realizable structure size of the circuit components for digital circuits and gates of microcontrollers. The solution presented here, combining a data bus interface known per se with a computer system known per se and several LED drivers known per se, results in the effect, surprising even to those skilled in the art, that the total chip area required by co-integration in a common semiconductor substrate does not increase to the extent that this increase in the chip area of the computer system is not offset by the savings in bond wires, bond pad areas and housings as from a certain number of LED drivers. This synergy effect, unexpected by those skilled in the art, due to the simplification of the system architecture resulting from the use of one semiconductor technology for the manufacture of the integrated circuit elements, far exceeds the expected cumulative effect of the increase in the chip area of the computer system. Neither in the products available on the market, nor in patent literature or in scientific or other technical literature, is there any reference to the solution according to the disclosure, since those skilled in the art would avoid increasing the chip area of the computer system; for those skilled in the art, it represents a paradigm shift if the computer system, as proposed according to the disclosure, is not realized in a semiconductor technology with the smallest possible structure size.

Another advantage of the disclosure is that driving lamps, in particular light-emitting diodes, requires only a limited amount of computing power of the computer system, so that a special performance of the computer system can be dispensed with here. Within the scope of the disclosure it was recognized that, as a result, compromises can also be made in the bit width of the ALU (and/or CPU) of the computer system and in the computing power of the computer system, in that by a realization of the computer system in the technology like that for the data bus interface and the lamp drivers the chip area required by the computer system increases and the realizable computing power of the computer system decreases due to the increased area requirement for the conductor tracks within the computer system (with the same chip area available for the computing system), on the other hand, however, the computing power associated with the otherwise increasing chip area of the computer system with the same number of gates is not required at all for driving the lamps and for operating the data bus interface, which is surprising for those skilled in the art.

The effort for a system can be estimated according to the prior art as follows:

$$K_{gd} = K_{TDB}*(K_{DBDB}+K_{DB}+K_{GDBRS})+K_{TRS}*(K_{GRSDB}+K_{RS}+K_{GRSLEDD})+n_{LED}*K_{TLEDD}*(K_{GLEDDRS}+K_{LEDD}+K_{GLEDDLED})$$

The meaning of the parameter designations is as follows:

$K_{DBDB}$ technical hardware effort of the interface to the data bus in the data bus interface, comprising e.g. bond pads, housing connections etc.;

$K_{DB}$ technical hardware effort of the interface, which is independent of the integration form;

$K_{GDBRS}$ technical hardware effort of the interface between data bus interface and computer system on the side of the data bus interface, including e.g. bond pads, housing connections of the data bus interface etc.;

$K_{TDB}$ semiconductor technology specific, monetary cost factor for the realization of the hardware effort of the data bus interface;

$K_{GRSDB}$ technical hardware effort of the interface between data bus interface and computer system on the side of the computer system, including e.g. bond pads, housing connections of the computer system etc.;

$K_{RS}$ technical hardware effort of the computer system, which is independent of the integration form;

$K_{GRSLEDD}$ technical hardware effort of the interface between the computer system and the $n_{LED}$ lamp drivers on the side of the computer system, including e.g. bond pads, housing connections of the computer system etc.;

$K_{TRS}$ semiconductor technology specific, monetary cost factor for the realization of the hardware effort of the computer system;

$K_{GLEDDRS}$ technical hardware effort of the interface between computer system and a driver for a lamp on the side of the driver for the lamp, comprising e.g. bond pads, housing connections of the driver for the lamp etc.;

$K_{LEDD}$ technical hardware effort of the driver for the lamp, which is independent of the integration form;

$K_{GLEDLEDD}$ technical hardware effort of the interface between the driver for the lamp and the lamp, which the respective driver for the lamp supplies with electrical power, on the side of the driver for the lamp, comprising e.g. bond pads, housing connections of the driver for the lamp etc.;

$K_{TDB}$ semiconductor technology specific, monetary cost factor for the realization of the hardware effort of the driver for the lamp;

$n_{LED}$ number of lamps or lamp groups and thus of drivers for lamps in the overall system;

$K_{gd}$ economic effort for the overall system with discrete components.

For example, the overall system parts whose chip area is dominated by power drivers, which would be the case for the data bus and/or test interface and/or sensor interface and the lamp drivers as well as for a voltage regulator, if present, could be manufactured in a first technology on a first semiconductor substrate (IC chip) in a first semiconductor technology with a first structure size while the computer system, which has predominantly small digital transistors, could be manufactured on a second semiconductor substrate (IC chip) in a second semiconductor technology with a second structure size, the second structure size being smaller than the first structure size.

Thus, the following can be defined:

$K_{gLEDDDS}$ economic effort for a system where only the computer system is realized separately from the data bus interface and the drivers for the lamps.

This economic effort is then calculated as follows:

$$K_{gLEDDDS} = K_{TDB}*(K_{DBDB}+K_{DB}+K_{GDBRS}+\eta_{LED}* (K_{GLEDDRS}+K_{LEDD}+$$

$$K_{GLEDDLED})) + K_{TRS}*(K_{GRSDB}+K_{RS}+K_{GRSLEDD}).$$

Now, the following is searched for:

$$K_{gd} > K_{gLEDDDS}$$

This corresponds to:

$$K_{TDB}*(K_{DBDB}+K_{DB}+K_{GDBRS})+K_{TRS}*(K_{GRSDB}+K_{RS}+ K_{GRSLEDD})+n_{LED}*K_{TLEDD}*(K_{GLEDDRS}+K_{LEDD}+ K_{GLEDDLED})$$

$$<K_{TDB}*(K_{DBDB}+K_{DB}+K_{GDBRS}+n_{LED}*(K_{GLEDDRS}+ K_{LEDD}+K_{GLEDDLED}))+K_{TRS}*(K_{GRSDB}+K_{RS}+ K_{GRSLEDD})$$

This is equivalent to:

$$K_{TDB}*(K_{DBDB}+K_{DB}+K_{GDBRS})+n_{LED}*K_{TLEDD}* (K_{GLEDDRS}+K_{LEDD}+$$

$$K_{GLEDDLED}) < K_{TDB}*(K_{DBDB}+K_{DB}+K_{GDBRS}+n_{LED}* (K_{GLEDDRS}+K_{LEDD}+K_{GLEDDLED}))$$

For $K_{TLEDD}=K_{TDB}$, there is no significant difference, which can also be observed on the market and is the reason for the solution proposed according to the disclosure, which does not exist in the prior art.

However, the integration proposed with the disclosure relates to all the overall system components being fabricated in a common semiconductor technology on and in a common semiconductor substrate (IC chip), this semiconductor technology being determined by the one used to realize the lamp drivers.

So the following can be defined:

$K_{gV}$ economic effort for a system where only the computer system and the data bus interface and the drivers for the lamps are realized on a common semiconductor crystal.

This is then calculated as follows, wherein $K_{GDBRS}$, $K_{GLEDDRS}$, $K_{GRSDB}$ and $K_{GLEDDLED}$ are now omitted as costs for the overall system-internal interfaces:

$$K_{gV}=K_{TDB}*(K_{DBDB}+K_{DB}+K_{RS}+n_{LED}*K_{LEDD}+ n_{LED}*K_{GLEDDLED})$$

Now, the following is searched for:

$$K_{gV} < K_{gLEDDS}$$

This corresponds to:

$$K_{TDB}*(K_{DBDB}+K_{DB}+K_{RS}+n_{LED}*K_{LEDD}+ n_{LED}*K_{GLEDDLED}) < K_{TDB}*(K_{DBDB}+ K_{DB}+K_{GDBRS}+n_{LED}*(K_{GLEDDRS}+$$

$$K_{LEDD}+K_{GLEDDLED}))+K_{TRS}*(K_{GRSDB}+K_{RS}+ K_{GRSLEDD})$$

This calculation can be simplified to:

$$K_{RS}<K_{GDBRS}+n_{LED}*(K_{GLEDDRS})+(K_{TRS}/K_{TDB})* (K_{GRSDB}+K_{RS}+K_{GRSLEDD})$$

Resolving to BLED results in:

$$((K_{RS}-K_{GRSDB})*(1-(K_{TRS}/K_{TDB}))-(K_{TRS}/K_{TDB}) *K_{GRSLEDD})/(K_{GLEDDRS})<n_{LED}$$

It was thus recognized according to the disclosure that from a certain number of drivers for the lamps on it is more favorable, contrary to the generally accepted opinion of persons skilled in the art, to accommodate the drivers and thus the overall system consisting of data bus interface, computer system and drivers of the lamps on a semiconductor crystal.

Thus, in particular, the integration of a CAN transceiver, for example, as an exemplary data bus interface together with a microcontroller as a computer system for processing the CAN protocol and for controlling an actuator together with the actuator driver (e.g. driver of the lamp) is proposed here.

Thus, a control device for a lighting device with, for example, a CAN bus data bus interface and with a computer system and with a driver circuit as a driver for one or more LED lamps is proposed here, which can typically comprise one or more light emitting diodes.

The CAN bus transceiver and the computer system and the driver circuit for the one lamp or the multiple lamps are thereby accommodated on a common semiconductor crystal or substrate such as a p-doped silicon substrate.

Instead of being used to drive an LED lighting device, the device according to the disclosure can also be used to drive lighting devices with other lamps, or to drive an optical and/or acoustic and/or tactile signaling device, or to drive a measuring means, in particular an optical, electrical, inductive or capacitive measuring means. Accordingly, the at least one driver circuit is then a driver for a signaling means (lamp, loudspeaker, buzzer, vibration element) or for a measuring means (measurement transducer).

Further configurations of the disclosure have the following features:

Feature 1. A control device for a lighting or optical signaling device or an optical measuring means in vehicles
comprising a data bus interface which may be a CAN bus data bus interface, and
comprising a computer core, and
with a number $n_{LED}$ of several driver circuits,
wherein $n_{LED}$ is a positive integer greater than 1,
each driver circuit is configured to be able to supply at least one lamp group with electrical power, and
wherein the $n_{LED}$ driver circuits are thus configured to be able to supply at least $n_{LED}$ lamp groups with electrical energy, and
wherein each lamp group comprises one or more lamps, which can comprise one or more light-emitting diodes, and
wherein the data bus interface and the computer core and the $n_{LED}$ driver circuit are accommodated on a common semiconductor crystal.

Feature 2. The control device for a lighting or optical signaling device or an optical measuring means in vehicles
comprising a data bus interface in the form of a CAN bus transceiver, and
comprising a computer core, and
with a number $n_{LED}$ of several driver circuits,
wherein $n_{LED}$ is a positive integer greater than 1,
each driver circuit is configured to be able to supply at least one lamp group with electrical power, and
wherein the $n_{LED}$ driver circuits are thus configured to be able to supply at least $n_{LED}$ lamp groups with electrical energy, and wherein each lamp group comprises one or more lamps, which can comprise one or more light-emitting diodes, wherein the overall system consisting of data bus interface and computer system and drivers of lamps are accommodated on a semiconductor crystal, and wherein thus the data bus interface and the computer core and the $n_{LED}$ driver circuits of the lamps are accommodated on a common semiconductor crystal.

The following features may individually or in combination be the subject of exemplary examples of the disclosure:

Features 1. A semiconducting substrate in which the circuit elements of the data bus interface (transceiver), of the microcontroller and of the at least one LED driver circuit and possibly also of the voltage regulator are integrated, the semiconductor substrate typically being a p-type semiconducting substrate.

Feature 2. A metallization stack common to the aforementioned three or four components as well as to any other components that may have circuit elements.

Feature 3. The metallization stack may include insulating layers common to the aforementioned three or four components as well as to any other components that may have circuit elements.

Feature 4. The metallization stack may include metal layers common to the aforementioned three or four components as well as to any other components that may have circuit elements.

Feature 5. The metal layers of the metallization stack comprise electrical lines patterned by means of a microstructure technique. At least one of these lines connects two of the aforementioned components or components of the semiconducting substrate having further circuit elements.

Feature 6. A lighting device according to the disclosure may have one or more features of the following list of features:
1. ground line,
2. a supply voltage line,
3. a data bus,
4. one or more LED groups, each LED group comprising one or more LEDs,
5. a control IC,
6. The control IC can comprise the following components:
  6.1. LED driver,
  6.2. PWM unit for PWM modulation of the driving of the LEDs,
  6.3. reference voltage source or reference current source,
  6.4. a computing unit (microcontroller),
  6.5. a (e.g. CAN) data bus interface,
  6.6. a test interface for performing a production test and/or a boundary scan test, wherein the test interface can be multiplexed with connections of the control IC,
  6.7. a clock generator
  6.8. an ADC with several ADC inputs,
  6.9. a voltage regulator (optional),
7 wherein the computing unit comprises a memory in the form of RAM and/or ROM or flash memory or One Time Programmable (OTP) memory or another non-volatile memory, and/or
8. wherein the computing unit comprises a CPU or ALU, and/or
9. wherein the computing unit comprises an interrupt logic, and/or
10. wherein the computer unit comprises control registers or control signal generators which generate control signals for the control of the PWM units, and/or
11. wherein the CPU of the computer unit can influence said control registers or control signal generators, and/or
12. wherein the computing unit is connected to the CAN data bus interface via a data bus, and/or
13. wherein the LED drivers energize the LEDs with a PWM-modulated or otherwise pulse-modulated current as a function of PWM signals of the PWM units and as a function of signals of the reference voltage source and/or reference current source and as a function of a signal of the clock generator, and/or
14. wherein the PWM units generate the PWM signals depending on states of the control signals, and/or
15. wherein the device performs an auto-addressing process, and/or
16. wherein the computing unit is connected to the ADC via a data bus, and/or
17. wherein the voltage regulator supplies the components of the control IC with electrical energy from the supply voltage line and the ground line.

The device according to the disclosure enables a more compact design and cost-effective manufacture of lighting devices for e.g. vehicle applications as interior lighting or for ambient light applications in vehicles.

What is claimed is:

1. A device for driving an LED lighting device, comprising:
an input designed as a data interface for connection to a communication data bus,
an output with at least one terminal for at least one LED lamp, the LED lamp comprising an LED or a series circuit of LEDs or a group of differently colored LEDs or a series circuit of groups of respectively differently colored LEDs,
a microcontroller,
one or more LED driver circuits, wherein an LED driver circuit is associated with each terminal of the output for the LED lamp,
wherein the data interface, the microcontroller, and the LED driver circuit or the LED driver circuits comprise electronic and/or electrical circuit elements,
a semiconductor substrate in which the circuit elements of the data interface, the microcontroller and the LED driver circuit or the LED driver circuits are integrated using a semiconductor technology for manufacturing integrated circuits with a smallest possible structure size predetermined by the semiconductor technology,
wherein the semiconductor technology used is determined by what minimum structure size is permissible for the circuit elements of the data interface and the LED driver circuit or the LED driver circuits in order to ensure their functionality,
wherein the data interface and/or the at least one LED driver circuit comprises circuit elements, the structure size of which is equal to the smallest possible structure size determined by the semiconductor technology, and
wherein the microcontroller comprises circuit elements of which those with the smallest structure size have a structure size equal to the structure size of the circuit elements of the data interface and/or the at least one LED driver circuit with the smallest possible structure size determined by the semiconductor technology.

2. The device according to claim 1, wherein a voltage regulator comprises circuit elements integrated in the semiconductor substrate, wherein the semiconductor technology used is determined by what minimum structure size is permissible for the circuit elements of the data interface, of the LED driver circuit or the LED driver circuits and of the voltage regulator in order to ensure their functionality, and wherein circuit elements of the data interface and/or of the at least one LED driver circuit and/or of the voltage regulator having the smallest possible structure size have a same structure size as circuit elements of the microcontroller having the smallest structure size.

3. The device according to claim 1 wherein a test interface includes electronic and/or electrical circuit elements integrated in the semiconductor substrate for testing the functionality of the data interface and/or of a microcontroller and/or of the LED driver circuit or the LED driver circuits and/or of a voltage regulator, if present, wherein the semiconductor technology used is determined by what minimum structure size is permissible for the circuit elements of the data interface, of the LED driver circuit or the LED driver circuits, of the voltage regulator and of the test interface in order to ensure their functionality, and wherein circuit elements of the data interface and/or of the test interface and/or of the at least one LED driver circuit and/or of the voltage regulator having the smallest possible structure size have a same structure size as circuit elements of the microcontroller having the smallest structure size.

4. The device according to claim 1 wherein a sensor system interface includes electrical and/or electronic circuit elements integrated in the semiconductor substrate for the connection of at least one sensor such as a light brightness sensor and/or a light color sensor and/or a sun sensor, which are or can be connected to a data communication bus adapted to be connected to the sensor system interface, wherein the semiconductor technology used is determined by what minimum structure size is permissible for the circuit elements of the data interface, of the LED driver circuit or the LED driver circuits, of a voltage regulator, of a test interface and of the sensor system interface in order to ensure their functionality, and wherein circuit elements of the data interface and/or of the test interface and/or of the sensor system interface and/or of the at least one LED driver circuit and/or of the voltage regulator having the smallest possible structure size have a same structure size as circuit elements of the microcontroller having the smallest structure size.

5. The device according to claim 1, wherein the microcontroller comprises only a functionality required to drive the LED driver circuit or the LED driver circuits in accordance with signals received from the data interface and/or signals received from a sensor system interface, if present, and required to process signals received from a test interface, if present.

6. The device according to claim 1, characterized in that the circuit elements, whose functionality must be ensured when manufacturing by means of the semiconductor technology used, are transistors and/or conductor tracks.

7. An LED lighting device provided with
an LED lamp, which comprises an LED or a series circuit of LEDs or a group of differently colored LEDs or a series circuit of groups of respectively differently colored LEDs,
wherein the LED lamp is electrically connected to the output of a device according to claim 1.

8. A method for manufacturing a device for driving an LED lighting device,
wherein the device is provided with:
an input designed as a data interface for connection to a communication data bus,
an output with at least one terminal for at least one LED lamp, which comprises an LED or a series circuit of LEDs or a group of differently colored LEDs or a series circuit of groups of respectively differently colored LEDs,
a microcontroller,
one or more LED driver circuits, wherein an LED driver circuit is associated with each terminal of the output for an LED lamp,
wherein the data interface, the microcontroller, and the LED driver circuit or the LED driver circuits comprise electronic and/or electrical circuit elements, and
a semiconductor substrate, the method comprising:
integrating the circuit elements of the data interface, the microcontroller and the LED driver circuit or the LED driver circuits in the semiconductor substrate using a semiconductor technology for manufacturing integrated circuits with a smallest possible structure size predetermined by the semiconductor technology, and
determining the semiconductor technology used by what minimum structure size is permissible for the circuit elements of the data interface and/or the LED driver circuit and/or the LED driver circuits in order to ensure their functionality,
wherein the data interface and/or the at least one LED driver circuit comprise circuit elements, the structure size of which is equal to the smallest possible structure size determined by the semiconductor technology, and
wherein the microcontroller comprises circuit elements of which those with the smallest structure size have a structure size equal to the structure size of the circuit elements of the data interface and/or the at least one LED driver circuit with the smallest possible structure size determined by the semiconductor technology.

9. The method according to claim 8, wherein the device has a voltage regulator with circuit elements integrated in the semiconductor substrate, wherein the semiconductor technology used is determined by what minimum structure size is permissible for the circuit elements of the data interface, of the LED driver circuit or the LED driver circuits and of the voltage regulator in order to ensure their functionality.

10. The method according to claim 8, wherein the device comprises a test interface having electronic and/or electrical circuit elements integrated in the semiconductor substrate for testing the functionality of the data interface and/or of the microcontroller and/or of the LED driver circuit or the LED driver circuits and/or of a voltage regulator, if present, wherein the semiconductor technology used is determined by what minimum structure size is permissible for the circuit elements of the data interface, of the LED driver circuit or the LED driver circuits, of the voltage regulator and of the test interface in order to ensure their functionality.

11. The method according to claim 8, wherein the device comprises a sensor system interface having electrical and/or electronic circuit elements integrated in the semiconductor substrate for the connection of at least one sensor such as a light brightness sensor and/or a light color sensor and/or a sun sensor, which are or can be connected to a data communication bus adapted to be connected to the sensor system interface, wherein the semiconductor technology used is determined by what minimum structure size is permissible for the circuit elements of the data interface, of the LED driver circuit or the LED driver circuits, of a voltage regulator, of a test interface and of the sensor system interface in order to ensure their functionality.

12. The method according to claim 8, wherein the microcontroller is provided only with a functionality required to drive the LED driver circuit or the LED driver circuits in accordance with signals received from the data interface and/or signals received from a sensor system interface, if present, and required to process signals received from a test interface, if present.

13. The method according to claim 8, wherein the circuit elements, whose functionality must be ensured when manufacturing by means of the semiconductor technology used, are transistors and/or conductor tracks.

14. The method according to claim 8, wherein the semiconductor technology used is a semiconductor technology with a smallest possible structure size that is larger than 85 nm or larger than 90 nm or larger than 100 nm or larger than 110 nm or larger than 120 nm or larger than 130 nm or larger than 140 nm or larger than 150 nm or larger than 160 nm or larger than 170 nm or larger than 180 nm or larger than 190 nm.

15. The method according to claim 8, wherein the semiconductor technology used is a semiconductor technology with a smallest possible structure size that is smaller than 200 nm or smaller than 190 nm or smaller than 180 nm or smaller than 170 nm or smaller than 160 nm or smaller than 150 nm or smaller than 140 nm or smaller than 130 nm or smaller than 120 nm or smaller than 110 nm or smaller than 100 nm or smaller than 90 nm or smaller than 85 nm.

* * * * *